United States Patent [19]

Sawamura

[11] Patent Number: 4,707,820
[45] Date of Patent: Nov. 17, 1987

[54] OPTICAL FILM AND PROCESS FOR PRODUCING SAME

[75] Inventor: Mitsuharu Sawamura, Yokohama, Japan

[73] Assignee: Canon Kabushiki Kaisha, Tokyo, Japan

[21] Appl. No.: 581,438

[22] Filed: Feb. 17, 1984

[30] Foreign Application Priority Data

Feb. 23, 1983 [JP] Japan .................................. 58-29078

[51] Int. Cl.$^4$ ............................. G11B 3/70; G02B 1/10
[52] U.S. Cl. ................................... 369/284; 346/76 L; 346/135.1; 350/164
[58] Field of Search ................. 350/164, 166; 369/284, 369/288; 346/76 L, 135.1

[56] References Cited

U.S. PATENT DOCUMENTS 3,858,965  1/1975  Sumita .................................. 350/164
4,260,222  4/1981  Kozawa .............................. 350/164

Primary Examiner—Bruce Y. Arnold
Attorney, Agent, or Firm—Fitzpatrick, Cella, Harper & Scinto

[57] ABSTRACT

An optical film comprises one or more layers at least one of which comprises $Ta_2O_5$ and $ZrO_2$, and a process for producing optical films comprising vapor deposition of a film comprising $Ta_2O_5$ and $ZrO_2$ on a substrate kept at a temperature between room temperature and 80° C. by using a sintered pellet comprising $Ta_2O_5$ and $ZrO_2$ as a raw material for vapor deposition.

7 Claims, 2 Drawing Figures

OPTICAL FILM AND PROCESS FOR PRODUCING SAME

BACKGROUND OF THE INVENTION

1. Field of the Invention

This invention relates to an optical film and a process for producing the same, and more particularly to an optical film having a high refractive index, suitable as an anti-reflecting film for opto-magnetic disks and optical disks, and to a process for producing such optical films.

2. Description of the Prior Art

As regards the prior art for producing optical films, there are known, for example, the process disclosed in U.S. Pat. No. 3,934,961, wherein an $Al_2O_3$-$ZrO_2$ mixed sinter is used as a raw material for vapor deposition in vacuo on a glass or plastic substrate, and the process disclosed in Japanese Laid-open Patent Publication No. 35,211/1975, wherein a $ZrO_2$-$TiO_2$ mixed sinter or $TiO_2$ alone is used as a raw material for vapor deposition in vacuo on a glass or plastic substrate.

However, the optical film formed from an $Al_2O_3$-$ZrO_2$ or $ZrO_2$-$TiO_2$ sinter by vapor deposition on a substrate kept at a temperature of about 20°–80° C. has a refractive index not sufficiently high but equivalent to that of $ZrO_2$ film.

On the other hand, an optical film of high refractive index can be formed by a process similar to the above but by keeping the substrate at a temperature of 300° C. or higher. However, it is undesirable that, in the process for producing opto-magnetic disks or optical disks, recording layers or heat insulation layers of methacrylic resin, rigid vinyl chloride resin, polycarbonate resin, urea resin, or polyethylene resin, supported on substrates be heated to a temperature of 300° C. or higher. In particular, during the formation of an optical film on such a heat insulation layer, the surface of this layer heated at or above 300° C. is liable to undergo oxidation, this being responsible for the development of "fog". Also, the recording layer on heating loses sometimes the ability to respond to laser beams.

Among optical films formed by vapor deposition on substrates kept at room temperatures, $ZrO_2$. $Ta_2O_5$ and $Nb_2O_3$ films exhibit refractive indexes as high as about 1.9, 2.0 and 2.1, respectively. These optical films can be formed on substrates by bombarding raw materials, $ZrO_2$, $Ta_2O_5$ and $Nb_2O_5$ sinters, for vapor deposition with electrons from an electron gun in vacuo. However, these raw materials, during the bombardment, scatter and then adhere in the form of fine particles onto the deposition film. This is a cause of the high percentage of defective products in the production of these films.

SUMMARY OF THE INVENTION

An object of this invention is to provide an optical film which overcomes the above noted disadvantages, particularly an optical film of high refractive index suited as an antireflection film.

Another object of this invention is to provide a process for producing an optical film having a high refractive index by vapor deposition on a substrate kept at room temperature or so.

Still another object of this invention is to provide a process for producing an optical film by vapor deposition without causing the scattering of a raw material for the vapor deposition or the contamination of the substrate surface or of the vapor deposited film with fine particles of the raw material.

A further object of this invention are achieved with an optical film comprising one or more layers at least one of which comprises $Ta_2O_5$ and $ZrO_2$ Still further objects of this invention are achieved with a process for producing an optical film, comprising vapor deposition of a film comprising $Ta_2O_5$ and $ZrO_2$ on a substrate kept at a temperature between room temperature and 80° C., by using a sintered pellet of $Ta_2O_5$—$ZrO_2$ mixture as a raw material for vapor deposition.

According to the present invention, there is provided an optical film comprising one or more layers at least one of which comprises $Ta_2O_5$ and $ZrO_2$ and a process for producing optical film comprising vapor deposition of a film comprising $Ta_2O_5$ and $ZrO_2$ on a substrate kept at a temperature between room temperature and 80° C. by using a sintered pellet comprising $Ta_2O_5$ and $ZrO_2$ as a raw material for vapor deposition.

DETAILED DESCRIPTION OF THE INVENTION

Figure 1:
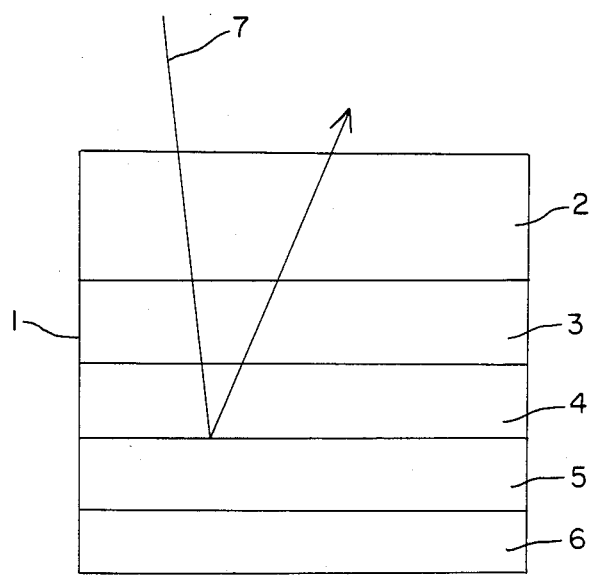
FIG. 1 is an illustration of an optical recording medium of Example 1 of the present invention.

The optical film of this invention comprises $Ta_2O_5$ and $ZrO_2$, and has a refractive index as high as 1.9 or more when containing $Ta_2O_5$ in a proportion of 1 mole or more to 1 mole of $ZrO_2$. The refractive index of the optical film can be predicted from the respective molecular weight, density, and vapor pressure of $Ta_2O_5$ and $ZrO_2$, and molar mixing ratios of $Ta_2O_5$ to $ZrO_2$. For instance, assume that the molar mixing ratio of $Ta_2O_5$ to $ZrO_2$ is a: 1, molecular weight ratio c: 1, density ratio d: 1, vapor pressure ratio b: 1, refractive index of $Ta_2O_5$, $n_T$, and refractive index of $ZrO_2$, $n_Z$. Then, the refractive index $n_{TZ}$ of the optical film to be formed at a given evaporation temperature T° K. can be represented by the formula $$n_{TZ} = \left( \frac{abc\sqrt{c}\ n_T^2 + d^2 n_Z^2}{abc\sqrt{c} + d^2} \right)^{\frac{1}{2}}. \tag{1}$$

Comparing $Ta_2O_5$ with $ZrO_2$, b is about 1, c about 3.6, and d about 1.6. Thus, according to the formula (1), $n_{TZ}$ is given by about 1.97 when a=1, and by about 2.0 when a=3.

The optical film of this invention can be produced in the following way: A mixed powder of $Ta_2O_5$ and $ZrO_2$ is shaped with a high-pressure press and hot pressed in a vacuum oven evacuated to about $10^{-2}$ Torr, forming a sintered pellet. The sinter as a raw material for vapor deposition and a substrate are fixed in a vapor deposition apparatus. Setting the pressure in the apparatus at a vacuum of about $10^{-5}$ Torr and the substrate temperature on a level between room temperature and 80° C., the sintered pellet is heated with an electron gun, thereby forming an optical film on the substrate without causing the adhesion of fine particles thereto.

A preferred embodiment of the present optical film is an effective antireflection film used in the fields of optical disk and opto-magnetic disk techniques. For instance, the optical film as an antireflection film can be laid either between a heat insulation layer (made of methacrylic resin, rigid vinyl chloride resin, polycarbonate resin, urea resin, or polyethylene resin), supported by a glass, metal, or plastic plate, and an opto magnetic recording layer or on the upper side of an opto-magnetic recording layer. In the former case, since the base insulation layer need not be heated to a high temperature, the "fog" phenomenon resulting from the surface oxidation caused by heating can be prevented. In the latter case, where the antireflection layer is laid on the upper side of an opto-magnetic recording layer, this recording layer, as a substrate for vapor deposition, need not be heated to a high temperature, so that the material for the opto-magnetic recording layer can be selected from a widespread range and a more favorable recording material can be readily chosen. The present optical film is especially effective as an antireflection film for the optical recording disk comprising a flat supporting disk and a layer thereupon made of a low-melting metal such as Te or Bi and for the opto-magnetic recording disk having a coating layer made of a metal such as TbFe, GdFe, GdCo, MnBi, GdTbFe or the like on which rewriting is possible.

The optical film of this invention can be formed to have an optical thickness of $\lambda/4$ or $\lambda/2$ ($\lambda$: the wavelength of a ray used for recording). In particular, the optical film formed to have a thickness of about 2000 Å can be used as an effective antireflection film. The film having a refractive index of 1.9 or more can be formed by using the raw material sintered pellet in which the molar ratio of $Ta_2O_5/ZrO_2 \geq 1$. Such a film, particularly favorable in this invention, can be used not only as an antireflection film in the fields of optical disk and opto-magnetic disk techniques but also as an antireflection film or an interferance coat in other technical fields, for example, the field of optical instruments wherein lens systems are used.

The optical film of this invention can be formed not only as a single or plurality of layers comprising $Ta_2O_5$ and $ZrO_2$ but also as a plurality of layers comprising said layer in combination with another film such as a $TiO_2$ film, $ZrO_2$ film or $Nb_2O_5$ film.

This invention is illustrated further referring to the following Examples:

EXAMPLE 1

A $Ta_2O_5$-$ZrO_2$ (molar ratio 1:1) mixed powder was shaped with a press and hot-pressed at 1000° C. under a vacuum of $10^{-2}$ Torr, forming a sintered pellet.

A poly (methyl methacrylate) resin having a heat conductivity of $5 \times 10^{-4}$ cal/cm·sec·°C. was spinner-coated on a base glass disk of 20 cm in dia. and 5 mm in thickness, surface-polished to optically acceptable precision, forming a heat insulation layer.

Then, the sintered pellet, which had been kept at room temperature, was heated with an electron gun under a vacuum of $10^{-5}$ Torr to deposit a 2000 Å thick $Ta_2O_5$-$ZrO_2$ film as an antireflection film on the heat insulation layer. This deposition film was found to have a refractive index of 1.96 and no adhesion thereto of fine particles was observed that would be caused in conventional vapor deposition processes by the scatting phenomenon characteristic of $Ta_2O_5$.

Thereafter, a GdTbFe film was formed as a recording layer on the antireflection film by sputtering to a thickness of $0.1\mu$, and an $SiO_2$ film was formed as a protecting coat on the recording layer by vapor deposition to a thickness of $1\mu$, thus completing a recording medium as illustrated in FIG. 1. The formed recording medium 1 consisted of a substrate 2, a heat insulation layer 3, an antireflection film 4, a recording layer 5, and a protecting coat 6. Information was recorded on this recording medium with a semiconductor laser of wavelength 0.83 $\mu$m and reproduced, by the reflection of laser light giving good S/N ratios.

The anti-reflecting coat was found excellent also in clarity, adhesion, and weather resistance.

COMPARATIVE EXAMPLE 1

A 2000 Å thick anti reflection film was formed in the same manner as in Example 1 but using a sintered pellet prepared from a $Ta_2O_5$ powder alone, in place of the one prepared from the $Ta_2O_5$-$ZrO_2$ mixed powder. As a result, fine particles formed from the $Ta_2O_5$ sintered pellet by the scattering phenomenon were observed adhering onto the anti reflection film.

In the same manner, 2000 Å thick anti reflection films were formed by using sintered pellets prepared separately from $ZrO_2$ and $Nb_2O_5$ powders. The results were similar to the above case of $Ta_2O_5$ alone

EXAMPLE 2

A $Ta_2O_5$-$ZrO_2$ (molar ratio 3:1) mixed powder was shaped with a press and hot-pressed at 1000° C. under a vacuum of $10^{-2}$ Torr, forming a sintered pellet.

A polycarbonate resin having a heat conductivity of $4.6 \times 10^{-4}$ cal/cm·sec·°C. was spinner coated on a base glass disk of 20 cm in dia. and 5 mm in thickness surface-polished to optical precision, forming a heat insulation layer.

Then, the sintered pellet, which had been kept at room temperature, was heated with an electron gun under a vacuum of $10^{-5}$ Torr to deposit a 2000 Å thick $Ta_2O_5$—$ZrO_2$ film as an anti reflection film on the heat insulation layer. The resulting film indicated a refractive index of about 1.99 and no adhesion thereto of fine particles was observed that would be caused by the scattering phenomenon characteristic of $Ta_2O_5$ in conventional vapor deposition processes.

Thereafter, the same recording layer as formed in Example 1 was laid on the anti-reflecting coat to complete a recording medium, and the same test thereof gave similar good results.

EXAMPLE 3

Figure 2:
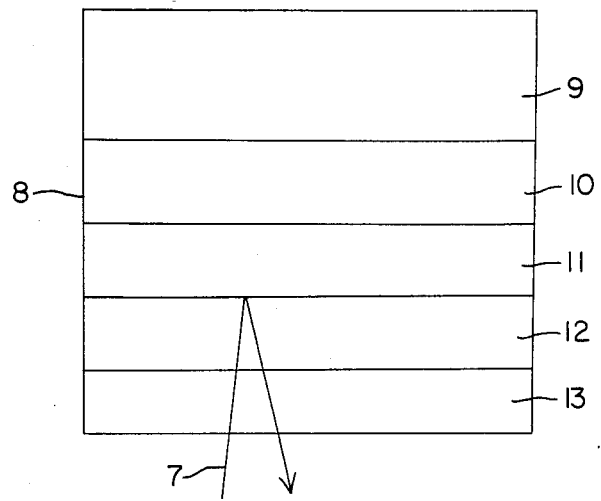
FIG. 2 is an illustration of an optical recording medium of Example 3 of the present invention.

An optical recording medium 8, as illustrated in FIG. 2 consisting of a glass substrate 9, heat insulation layer 10, an aluminum reflecing layer 11, recording layer 12 and an antireflection film 13, was formed as follows.

A poly(methyl methacrylate) resin having a heat conductivity of $5 \times 10^{-4}$ cal/cm·sec·°C. was spinner-coated on a base glass disk 9 of 20 cm in dia. and 5 mm in thickness surface-polished to optical precision, forming a heat insulation layer 10, which was then overlaid with an aluminum vapor deposition film as a reflecting layer 11.

This substrate was overlaid with the same recording layer as formed in Example 1. Then, the same $Ta_2O_3$-$ZrO_2$ sintered pellet as used in Example 1 was heated with an electron gun at room temperature under a vacuum of $10^{-5}$ Torr to deposit a 2000 Å thick $Ta_2O_5$-$ZrO_2$ film on the recording layer. The thus formed antireflection film 13 was completely free from the adhesion of fine particles which would be caused by scattering phenomenon characteristic of $Ta_2O_5$ Information writing in the recording layer and reading thereof were conducted with the same laser beam 7 as used in Example 1, giving good S/N ratios.

As is evident from the above Examples, the $Ta_2O_5$ scattering phenomenon which will be seen in the vapor evaporation of $Ta_2O_5$ can be prevented by using a $Ta_2O_5$-$ZrO_2$ mixed system according to this invention and thereby a good optical film can be obtained. Additionally, the substrate for vapor deposition in this invention can be selected from a wide variety of materials because the temperature of the substrate during vapor deposition can be set on a low level (room temperature ~80° C.). Thus, this invention is best suited for the production of antireflection films used in the technical fields of optical disks and opto-magnetic disks, the exposure of which to high temperature is undesirable.

What I claim is:

1. An optical recording medium comprising in series a substrate, a heat insulation layer, and a recording layer, wherein an antireflection film comprising $Ta_2O$ in the molar ratio of $Ta_2O_5$ to $ZrO_2$ of at least one is formed either on the side of the recording layer facing the substrate or on the side of the recording layer opposite the substrate.

2. An optical recording medium according to claim 1 wherein the antireflection film is formed on the side of the recording layer opposite the substrate.

3. An optical recording medium according to claim 1 wherein the antireflection film has a refractive index of at least 1.9.

4. An optical recording medium according to claim wherein the antireflection film has a refractive index of at least 1.99.

5. An optical recording medium according to claim 1, wherein the recording layer is an optical recording film.

6. An optical recording medium according to claim 1, wherein the recording layer is an opto-magnetic recording film.

7. An optical recording medium according to claim 1 wherein the antireflection film is formed on the side of the recording layer facing the substrate.

* * * * *

UNITED STATES PATENT AND TRADEMARK OFFICE
CERTIFICATE OF CORRECTION

PATENT NO. : 4,707,820  
DATED : November 17, 1987  
INVENTOR(S) : MITSUHARU SAWAMURA Page 1 of 2

It is certified that error appears in the above-identified patent and that said Letters Patent is hereby corrected as shown below:

COLUMN 1

Line 44, "$ZrO_2$. $Ta_2O_5$and" should read --$ZrO_2$, $Ta_2O_5$ and--.

COLUMN 2

Line 3, "are" should read --is--.

COLUMN 3

Line 37, "interferance" should read --interference--.

COLUMN 4

Line 8, "light" should read --light 7,--.  
Line 52, "reflecing" should read --reflecting--.  
Line 62, "$Ta_2O_3$-" should read --$Ta_2O_5$- --.

COLUMN 5

Line 13, "on" should read --at--.  
Line 21, "$Ta_2O$in" should read --$Ta_2O_5$ and $ZrO_2$ in--.

UNITED STATES PATENT AND TRADEMARK OFFICE
CERTIFICATE OF CORRECTION

PATENT NO. : 4,707,820

DATED : November 17, 1987

INVENTOR(S) : MITSUHARU SAWAMURA

Page 2 of 2

It is certified that error appears in the above-identified patent and that said Letters Patent is hereby corrected as shown below:

COLUMN 6

Line 10, "claim" should read --claim 1,--.

Signed and Sealed this

Tenth Day of May, 1988

Attest:

DONALD J. QUIGG

Attesting Officer

Commissioner of Patents and Trademarks